United States Patent [19]

Swart et al.

[11] Patent Number: 5,801,544

[45] Date of Patent: Sep. 1, 1998

[54] SPRING PROBE AND METHOD FOR BIASING

[75] Inventors: Mark A. Swart, Anaheim Hills; Gordon A. Vinther, Ontario, both of Calif.

[73] Assignee: Delaware Capital Formation, Inc., Wilmington, Del.

[21] Appl. No.: 783,467

[22] Filed: Jan. 16, 1997

[51] Int. Cl.⁶ ............................................. G01R 31/02
[52] U.S. Cl. ................................. 324/761; 324/754
[58] Field of Search ........................... 324/761, 754, 324/72.5; 439/482

[56] References Cited

U.S. PATENT DOCUMENTS

| | | | |
|---|---|---|---|
| 566,655 | 9/1896 | Johnston | 324/754 |
| 3,435,168 | 3/1969 | Cooney | 200/166 |
| 4,397,519 | 8/1983 | Cooney | 339/255 R |
| 4,560,223 | 12/1985 | Cooney et al. | 339/95 R |
| 4,885,533 | 12/1989 | Coe | 324/158 P |
| 4,904,935 | 2/1990 | Calma et al. | 324/754 |
| 5,175,493 | 12/1992 | Langgard | 324/72.5 |

FOREIGN PATENT DOCUMENTS

3410093A1  10/1985  Germany .
62-85872A    4/1987  Japan .

*Primary Examiner*—Ernest F. Karlsen
*Assistant Examiner*—Anh Phung
*Attorney, Agent, or Firm*—Christie, Parker & Hale, LLP

[57] ABSTRACT

A spring-loaded contact probe for performing tests on an electrical device. The probe includes an elongated plunger having an end with a convex surface retained within a barrel. A spring for applying an axial load is positioned within the barrel and a ball sized to translate a portion of the axial force into a side loading force is positioned between the spring and the convex surface of the plunger. The spring has a tightly wound coil adjacent the ball for maintaining the ball against the barrel.

12 Claims, 4 Drawing Sheets

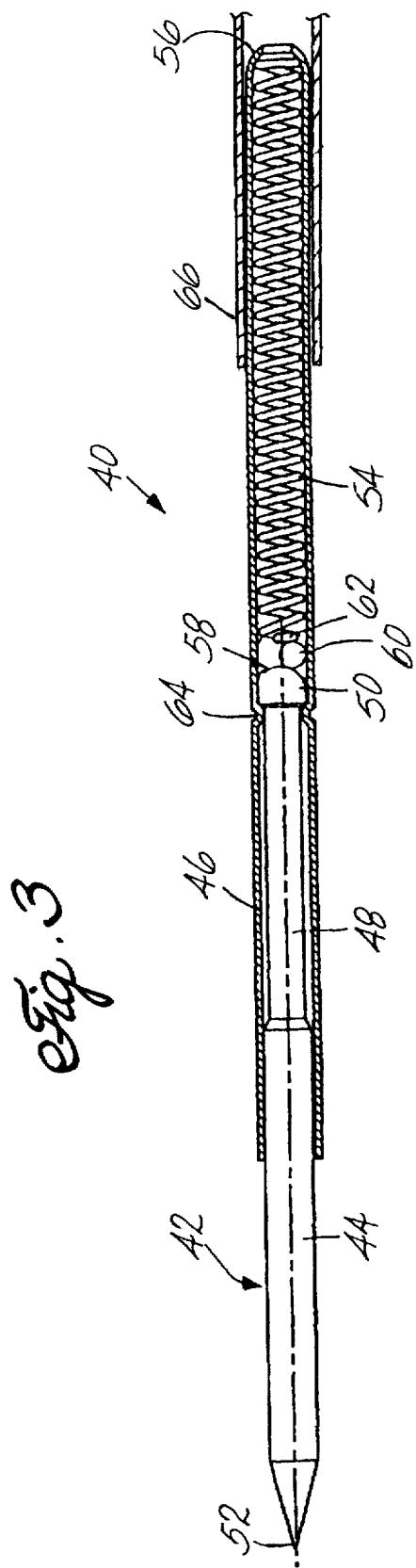

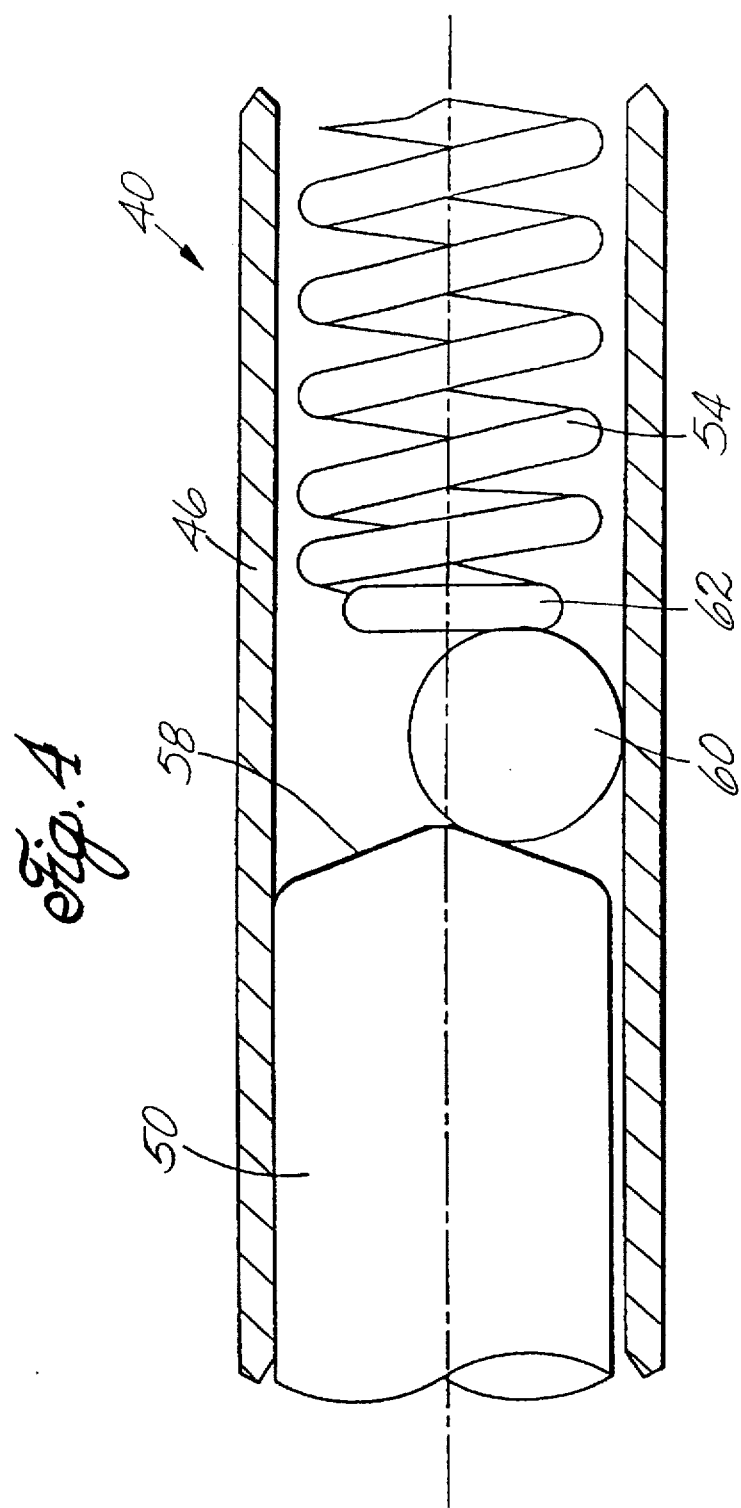

5,801,544

SPRING PROBE AND METHOD FOR BIASING

FIELD OF THE INVENTION

The present invention relates to electrical contact probes and, more particularly, to spring-loaded contact probes and an improved method for biasing the probes which are used in electrical testing applications such as providing electrical contact between diagnostic or testing equipment and an electrical device under test.

BACKGROUND OF THE INVENTION

Conventional spring-loaded contact probes generally include an outer receptacle, a movable plunger, a barrel containing the plunger, and a spring for biasing travel of the plunger in the barrel. The plunger is commonly biased outwardly a selected distance by the spring and may be biased or depressed inwardly of the barrel, a selected distance, under force directed against the spring. Biasing the plunger to the barrel prevents false opens or intermittent points of no contact between the plunger and the barrel. The plunger generally is solid and includes a head or tip for contacting electrical devices under test. Such conventional contact probes are generally referred to herein as three-component probes, since they have a receptacle, barrel and plunger.

In conventional devices, the barrel is mounted within the receptacle with the plunger extending outwardly from the receptacle. Preferably, the barrel is removably mounted in the receptacle, so that should damage occur to the barrel or plunger, replacement is possible. Usually, the receptacle is permanently or semi-permanently mounted in an array within the tester. Electrical wiring may be attached to the receptacle, for electrical communication between the receptacle and the testing diagnostic equipment. Preferably, the probe member, barrel and receptacle are manufactured from electrically conductive materials, so that an electrical circuit is maintained between the electrical device under test and test equipment, by means of the contact probe.

When such electrical probes are used, generally a contact side of the electrical device to be tested is brought into pressure contact with the tip of the plunger for maintaining spring pressure against the electrical device. After the electrical device has been tested, the pressure exerted by the spring probes is released and the device is removed from contact with the tip of each probe. In conventional systems, the pressure is released by moving the electrical device and probes away from one another, thereby allowing the plungers to be displaced outwardly away from the barrel under the force of the spring within the barrel, until an enlarged-diameter section of the plunger engages a crimped end portion of the barrel.

The process of making a conventional spring probe involves separately producing the compression spring, the barrel and the plunger. The compression spring is wound and heat treated to produce a spring of a precise size and of a controlled spring force. The plunger is typically turned on a lathe and heat treated and sometimes the barrels are heat treated. The barrel and receptacle are formed by a deep draw process. All components are subjected to a plating process to enhance conductivity. The spring probe components are assembled either manually or by an automated process. During assembly, the compression spring is first placed in the barrel, the plunger is then inserted into the barrel to compress the spring, and the barrel is roll crimped to retain the plunger. In use, the completed spring probes are commonly inserted into an outer receptacle for retaining the probe in a fixture or the like. The principal cost factors in producing these multi-component probes are the separate manufacturing costs of the components and the assembly time and equipment for producing the finished part.

A problem with conventional spring-loaded contact probes is the additional machining costs associated with methods of biasing the plunger within the barrel. Specifically a second machining process for cutting an angled surface on the back of the plunger is required to ensure that a portion of the axial load applied by the spring is converted into a side load to prevent false opens. Considering spring probes are produced by the thousands, the additional machining costs are substantial. Another problem associated with conventional spring probes is that an angled interface between the plunger and the spring limits the amount of compliance of the spring due to the spring being bent proximate to the interface.

Consequently, a need exists for an improved hollow plunger spring probe which eliminates the disadvantages associated with conventional spring-loaded contact probes.

SUMMARY OF THE INVENTION

Briefly, one embodiment of the invention comprises a spring-loaded contact probe for placement within a receptacle for performing electrical tests on a unit under test. The spring-loaded contact probe constructed according to the principles of this invention includes a plunger disposed within a barrel for slidable axial displacement within the barrel. The plunger includes a tip at one end positioned outside the barrel for electrical contact with the device under test. The plunger and barrel may be placed within a receptacle or can be directly mounted within a test fixture. A wire-up post or a receptacle post may extend into the receptacle through an opening at the opposite end of the barrel. A spring is positioned within the barrel adjacent to the end of the plunger opposite the tip. The end of the spring is tightly wound and a ball is positioned between the tightly wound end of the spring and the end of the plunger. The ball is sized so that the point of contact between the ball and the plunger end is at a location on the plunger which is less than the radius of the plunger bearing diameter.

The spring probe of the present invention eliminates the problems of previous spring probe designs be eliminating the angled surface on the back end of the plunger. By incorporating a ball between the plunger and the spring which is sized to assure side loading on the plunger, the angled surface does not need to be machined into the plunger and thus costs can be reduced. A ball of this size provides the required side loading with a normally turned end on the plunger by converting a portion of the axial load from the spring into a side load by contacting the plunger at a location above or below the midpoint of the plunger end.

These and other advantages of the invention will be more fully understood by reference to the drawings and the following detailed description.

BRIEF DESCRIPTION OF THE DRAWINGS

FIG. 3 is a cross-sectional side view of a spring probe of the present invention; and FIG. 4 is an enlarged detail in cross-section, of the spring probe of FIG. 3.

DETAILED DESCRIPTION

Figure 1:
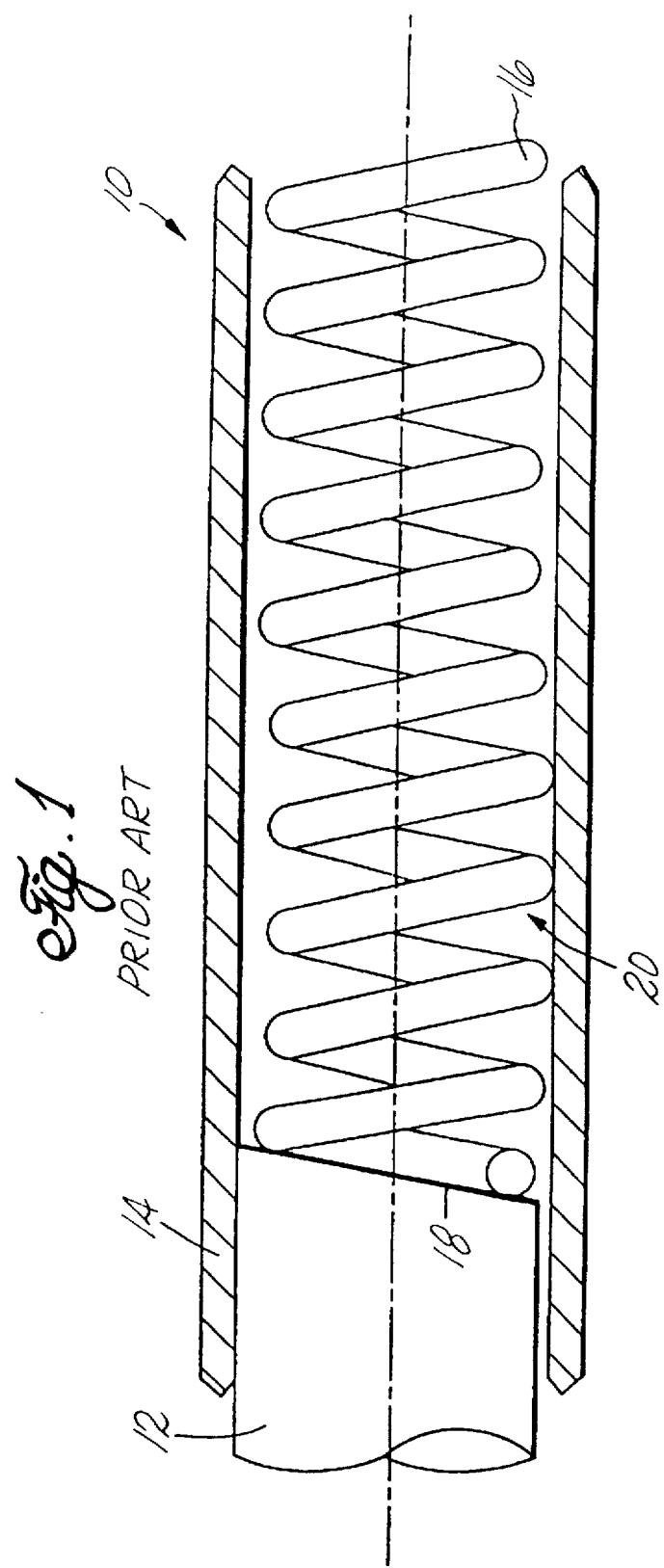
FIG. 1 is a partial cross-sectional side view of a prior art spring probe.

FIG. 1 illustrates a portion of a typical prior art spring-loaded test probe 10 used to perform diagnostic electrical tests on an electrical device such as, for example, a printed circuit board. The test probe 10 comprises a plunger 12 mounted within a barrel 14 which may be mounted within a receptacle (not shown). The plunger 12 is mounted within the barrel 14 so that the plunger extends axially away from the barrel so that it is capable of making contact with the electrical device under test. The barrel is tubular and circular in cross-section having a generally uniform diameter from end to end forming a long passage for receipt of the plunger. A spring 16 is positioned within the barrel and is axially aligned with the plunger. The spring 16 is positioned inside the hollow barrel against the end 18 of the plunger. End 18 is machined to have an angled surface thereby translating a portion of the axial force from spring 16 into a side force to bias the plunger 12 against the barrel 14. Two problems created with this prior art design are the requirement of the additional machining process to form the angled surface 18 and the resulting bending of the spring 16 in the area generally designated as 20. The spring becomes bent due to the angled surface between the plunger and the spring thereby eliminating the amount of compliancy of the spring.

Figure 2:
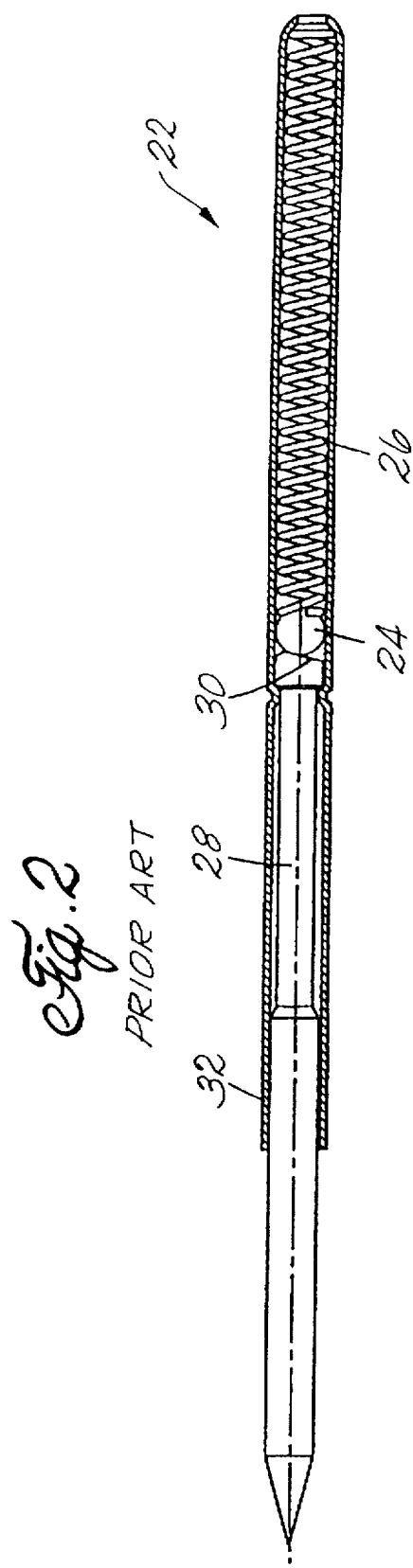
FIG. 2 is a cross-sectional side view of a second prior art spring probe.

To address the problem of limited compliancy due to spring bending, another prior art design as shown in FIG. 2 was developed. In this design the spring probe 22 includes a ball 24 positioned between the spring 26 and the plunger 28. By placing a ball between the spring and the plunger, bending is eliminated because the spring does not touch the angled surface 30 on the end of the plunger. The spring 26 applies an axial force to the plunger 28 through the ball 24. The angled surface 30 translates a portion of the axial force into a side loading force, thereby biasing the plunger 28 against the barrel 32. This prior art design, although eliminating the compliancy problem due to spring bending, still requires the expensive machining process for forming the angled surface 30 on the plunger.

The spring probe 40 of the present invention, as shown in FIGS. 3 and 4, has been designed to overcome the problems associated with limited spring compliancy due to spring bending and is inexpensive to manufacture because it does not require an angled surface to be machined on the end of the plunger for biasing. The spring probe 40 includes a plunger 42 which is typically solid and tubular and circular in cross-section having a number of varying diameters from end to end. The plunger includes a first section 44 having a diameter slightly smaller than the interior diameter of the barrel 46. First section 44 extends into the interior of the hollow barrel and terminates into a reduced diameter second section 48. The second section is entirely within the interior of the barrel 46 and terminates in an enlarged head portion 50. The head portion has a diameter slightly smaller than the internal diameter of the barrel. Located on the opposite end of first portion 44 is a probe tip 52 which extends axially away from the barrel so that it is capable of making contact with the electrical device under test. The probe tip has an end portion configured to facilitate electrical contact with the unit under test and may comprise a number of different geometric configurations such as a single point, multiple points, convex point and the like, depending upon the particular configuration of the electrical contacts on the device under test.

A spring 54 is positioned within the barrel between the end 56 of the barrel and the end 58 of head 50. End 58 has a substantially rounded or angled surface convexly turned during the lathing operation in the manufacturing of the plunger.

Positioned between spring 54 and end 58 is a ball 60 sized so that contact is made between the ball and end 58 at a location on the end which is either above or below the midpoint of the head. By contacting the end 58 at such a location, the ball provides for a translation of a portion of the axial force generated by the spring 54 into a side loading force on the plunger to bias the plunger against the barrel 46. The ball can be of any size which results in contact being made between the ball and the head 50 at a location along the end 58 which is less than the radius of the head, and can be at a point either above or below the midpoint of the end surface. The final coil 62 of the spring has been wound tightly to prevent the ball 60 from becoming seated in the end of the spring which may cause the ball to apply a force on the midpoint of the plunger resulting in no side loading or biasing of the plunger against the barrel.

The result of the present design is that a spring probe can be inexpensively manufactured which can bias the plunger with respect to the barrel without machining an angled surface on the end of the plunger. The plunger 42 is retained within the barrel 46 by a location crimp 64 formed in the barrel which abuts against the head portion 50. In certain applications, the spring probe 40 can be placed within a receptacle 66 generally mounted within a test fixture (not shown). The barrel and the receptacle each would be manufactured by a deep draw process commonly known in the art.

Although the present invention has been described and illustrated with respect to a preferred embodiment thereof, it is to be understood that it is not to be so limited, since changes and modifications may be made therein which are within the full intended scope of this invention as hereinafter claimed.

What is claimed is:

1. A contact probe for performing tests on an electrical device comprising a plunger having a convex end portion positioned within a barrel and means for biasing the plunger against a side of the barrel by making a single point contact with the convex end portion at a location away from a midpoint of the convex end portion.

2. The probe of claim 1 wherein the biasing means is a spring for exerting an axial force on the plunger positioned within the barrel and a ball positioned between the spring and the convex end portion of the plunger.

3. The probe of claim 2 wherein the spring has means for maintaining the ball against the barrel.

4. The probe of claim 3 wherein the means for maintaining the ball against the barrel is a coil adjacent the ball wound to a diameter substantially less than a diameter of the ball.

5. The probe of claim 2 wherein the ball is sized to translate a portion of the axial force into a side force by contacting the convex end portion at the location away from the midpoint of the convex end portion.

6. A spring-loaded contact probe for performing tests on an electrical device comprising:

an elongated plunger having a contact portion and an end portion opposite said contact portion;

a tubular barrel for receipt of at least a portion of said plunger;

said end portion including a convex surface retained within said barrel;

a spring for applying an axial load on the plunger located within the plunger; and a ball located within the barrel between the spring and the convex surface sized for translating a portion of the axial load into a side load by contacting the convex surface at a location away from a midpoint of the convex end.

7. The contact probe of claim 6 further comprising means for maintaining the ball in contact with the barrel.

8. The contact probe of claim 7 wherein the means for maintaining the ball in contact with the barrel comprises a coil adjacent the ball wound to a diameter substantially less than a diameter of the ball.

9. The contact probe of claim 6 further including a receptacle for receipt of at least a portion of the barrel.

10. A test probe comprising:

an elongated plunger having an end portion having a convex surface;

a tubular barrel for receipt of at least a portion of said plunger including the convex surface;

a spring positioned within the barrel; and a ball located within the barrel between the spring and the convex surface and contacting the convex surface away from the midpoint;

wherein the spring includes a coil adjacent the ball tightly wound to maintain the ball against the barrel.

11. The contact probe of claim 10 further comprising a receptacle for receipt of at least a portion of the barrel.

12. A contact probe for performing tests on an electrical device comprising:

an elongated tubular barrel having an inside surface and a central axis;

a plunger having an end section adapted for sliding contact within the barrel;

a spring in the barrel applying a biasing force toward the end section of the plunger;

a ball having a diameter substantially less than the diameter of the barrel and substantially less than the diameter of the plunger end section, the spring applying a bias to the ball, the end section of the plunger having an end surface for contact with the ball;

the ball being of substantially spherical configuration with a center offset from the central axis of the barrel when the ball is retained in an operative position within the barrel biased into contact with the end surface of the plunger by the spring force applied to the ball by the spring;

said spring force applied to the ball causing the ball to apply a side load to the plunger end section for enhancing sliding contact between the plunger end section and the inside surface of the barrel.

\* \* \* \* \*